United States Patent [19]

Ueda

[11] Patent Number: 4,610,076

[45] Date of Patent: Sep. 9, 1986

[54] METHOD OF MANUFACTURING AN INSULATED GATE FIELD EFFECT TRANSISTOR

[75] Inventor: Seiji Ueda, Otsu, Japan

[73] Assignee: Matsushita Electronics Corporation, Osaka, Japan

[21] Appl. No.: 655,672

[22] Filed: Sep. 28, 1984

[30] Foreign Application Priority Data

Oct. 3, 1983 [JP]  Japan .................. 58-185291

[51] Int. Cl.$^4$ ............................................. H01L 21/38
[52] U.S. Cl. ........................................ 29/571; 29/578; 148/187; 148/188; 148/189
[58] Field of Search .................. 29/571, 578; 148/187, 148/188, 189

[56] References Cited

U.S. PATENT DOCUMENTS

| | | | |
|---|---|---|---|
| 4,266,985 | 5/1981 | Ito et al. ........................ | 148/187 X |
| 4,345,265 | 8/1982 | Blanchard et al. ............. | 148/187 X |
| 4,366,613 | 1/1983 | Ogura et al. .................... | 29/571 |
| 4,397,887 | 8/1983 | Aytac et al. .................... | 29/571 X |
| 4,404,733 | 9/1983 | Sasaki ............................. | 148/187 X |
| 4,433,468 | 2/1984 | Kawamata ...................... | 29/571 |
| 4,443,931 | 4/1984 | Baliga et al. ................... | 29/571 |
| 4,498,224 | 2/1985 | Maeguchi ....................... | 29/571 |

*Primary Examiner*—George T. Ozaki
*Attorney, Agent, or Firm*—Spencer & Frank

[57] ABSTRACT

In a method of manufacturing a semiconductor device, a thin silicon dioxide (SiO$_2$) film for a gate insulation film and a polycrystalline silicon layer are successively deposited on a semiconductor substrate having one electrical conductivity type whereby this polycrystalline silicon layer has a gate electrode pattern. In this step a part of the polycrystalline silicon layer is left at a part where an electric contact with the substrate is to be formed. Parts of source and drain regions are formed by the self-align method with this polycrystalline silicon layer as a mask. A thick passivation film for an interlayer insulation film is formed to cover the whole surface. An aperture is formed selectively in the passivation film to expose the whole polycrystalline silicon layer at the part where the contact is formed. The polycrystalline silicon layer in the aperture part and the thin insulation film thereunder are removed to expose a part of the semiconductor substrate. An impurity is introduced into this exposed part to form a contact region overlapped with a part of the above-mentioned source and drain regions. Therefore, the aperture part for a contact with source and drain regions can be formed without a step of mask adjustment. Thus, a highly integrated function device can be easily realized.

3 Claims, 15 Drawing Figures

METHOD OF MANUFACTURING AN INSULATED GATE FIELD EFFECT TRANSISTOR

BACKGROUND OF THE INVENTION

1. Field of the Invention

This invention relates to a method of manufacturing a semiconductor device, and more particularly to a multilayer-wiring structure with polycrystalline silicon which is capable of increasing the integration density.

2. Description of the Prior Art

In recent MOS integrated circuit devices, miniaturization of elements has become so advanced that pattern dimensions are approaching the micron or submicron range. One of the most important problems in the miniaturization of the elements lies in the formation of a micro-pattern by the photolithographic method. Even a miniature pattern with a size of one micron is going to be in practical use.

Meanwhile, the design of multilayer structures is progressing along with a tendency toward high density semiconductor integrated circuit devices. An important factor in the multilayer structure is improvement of the superposition accuracy. However, the fact that this accuracy depends strongly on the mechanical accuracy of an exposure apparatus has retarded an increase in the integration density.

SUMMARY OF THE INVENTION

This invention provides a method of manufacturing a semiconductor device, in which the apertures for leading out the electrodes from the usual MOS integrated circuit device are formed without depending on the accuracy with which masks are superimposed but rather in a self-aligning way. Electrodes are led out without any pattern shift, hence the density of integration is much improved.

The manufacturing method of this invention comprises the steps of depositing an insulation film and a polycrystalline silicon layer successively on a semiconductor substrate, forming a prescribed gate electrode or a wiring layer on the polycrystalline silicon layer by the photolithographic method and leaving the polycrystalline silicon layer on a part from which electrodes are led out from the substrate, diffusing an impurity into the substrate, depositing an interlayer insulation film on the substrate, removing the interlayer insulation film on the polycrystalline silicon layer remaining on the part from which electrodes are led out from the substrate and thereafter selectively removing the remaining polycrystalline silicon layer with the interlayer insulation as a mask, diffusing an impurity into this aperture part, and forming a film with an electric conductivity and connecting this film with the impurity-diffusion region formed on the substrate in the aperture part. In this manner, the gap between the aperture for contacting electrodes with the source and drain regions and the gate electrode becomes independent of the accuracy of superposition of the masks. This method facilitates realization of a large integration density.

DESCRIPTION OF THE PREFERRED EMBODIMENTS

The manufacturing method of the prior art silicon gate MOS semiconductor integrated circuit device will be described first hereinafter with reference to the drawings.

Figure 1:
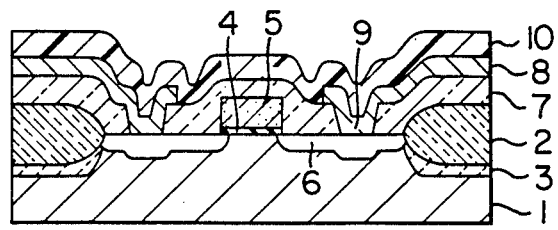
FIG. 1 is a cross-section showing the structure of a prior art MOS type device.

In FIG. 1 showing a partial cross-section of the structure of the prior art silicon gate MOS integrated circuit device, 1 denotes a P-type silicon substrate, 2 a film of silicon dioxide formed by selective oxidation, 3 a channel stopper formed by a boron diffusion layer, 4 a gate insulation film, 5 an impurity-doped polycrystalline silicon electrode, 6 source and drain regions of an impurity diffusion layer having an electrical conductivity type opposite that of the substrate, 7 a silicon dioxide film, and 8 an aluminum alloy which is electrically connected with the impurity diffusion layer 6 through an aperture portion 9 of the silicon dioxide film 7. In order to form the aperture 9 and lead out an electrode through the aluminum alloy 8, the step of photolithography is necessary. There should be a gap between the aperture 9 and the polycrystalline silicon electrode 5 but the distance depends on the accuracy of superposing a mask and the accuracy of etching the silicon dioxide film 7. With an increase in the integration density, it has become an important problem to make this distance as small as possible.

In FIG. 2, cross-sections of the MOS integrated circuit device of FIG. 1 are shown in order for each of the manufacturing steps.

Figure 2A:
FIGS. 2a to 2e are cross-sections showing manufacturing steps of the above prior art device.
Figure 2B:
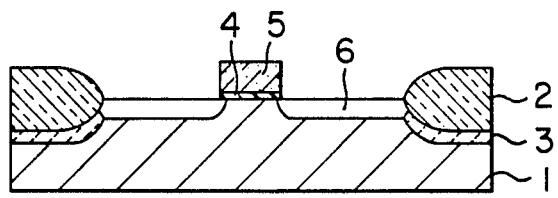
Figure 2C:
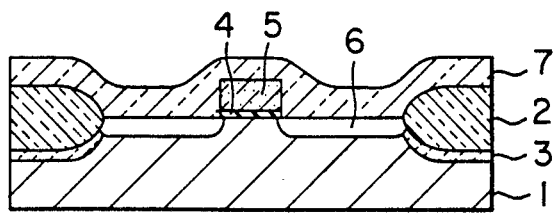
Figure 2D:
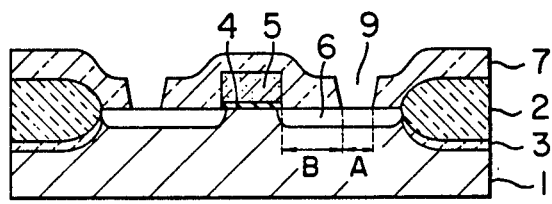
Figure 2E:
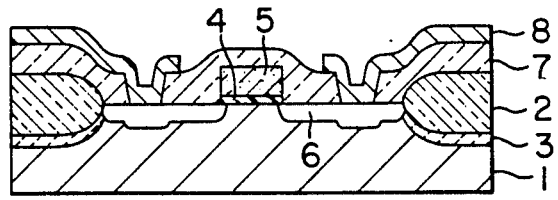

In FIG. 2a, 1 denotes a P-type silicon substrate, 2 a silicon dioxide film formed by the selective oxidation method and 3 a channel stopper formed by a boron diffusion layer. As shown in FIG. 2b, a gate oxide layer film 4 and a polycrystalline silicon film 5 are formed. A gate electrode pattern is formed by photolithography. Thereafter, an N+ diffusion region 6 is formed by arsenic. A silicon dioxide film 7 is deposited, as shown in FIG. 2c. An aperture 9 is formed by photographic etching, as shown in FIG. 2d. If the reduction projection method is applied by using ultraviolet light, the distance B between the aperture 9 and the polycrystalline electrode 5 should be at least 2 microns for an aperture size A of 1.5 microns if the required superposition accuracy is to be obtained. Next, an impurity with the same electric conductivity type as that of the N+ diffusion region 6 is diffused into the aperture 9. An aluminium alloy 8 is evaporated, as shown in FIG. 2e, to form a pattern and lead out an electrode from the N+ diffusion region 6. The structure of FIG. 1 is obtained by depositing a passivation film 10.

In the above-mentioned prior art method, even if the reduction projection applied, the dimension B should have be 2 microns to provide the required superposition accuracy and a margin. Although the pattern dimension can be reduced to obtain an aperture of about 1 micron, accuracy of superposition would not follow. This has been the reason why any large improvement in the degree of integration could not be expected.

DESCRIPTION OF THE PREFERRED EMBODIMENTS

Figure 3A:
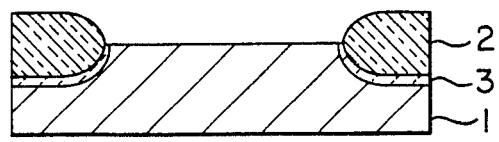
FIGS. 3a to 3i are cross-sections showing sequential manufacturing steps of an MOS type device according to this invention.
Figure 3B:
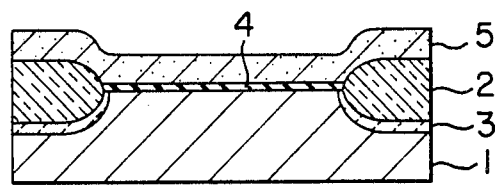
Figure 3C:
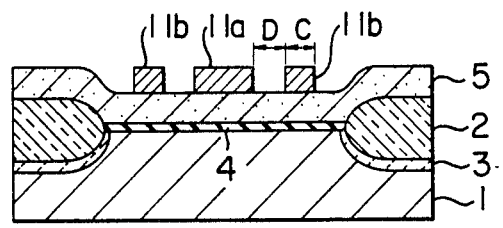
Figure 3D:
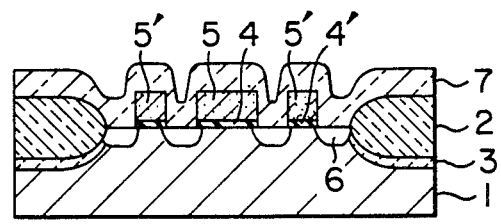
Figure 3E:
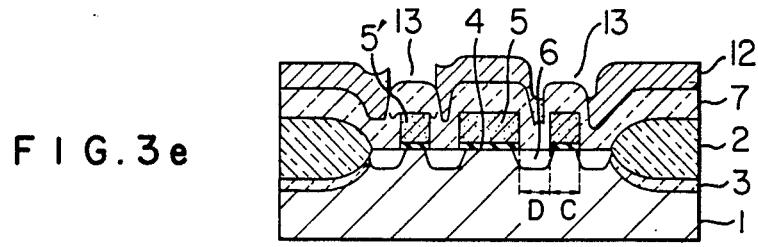
Figure 3F:
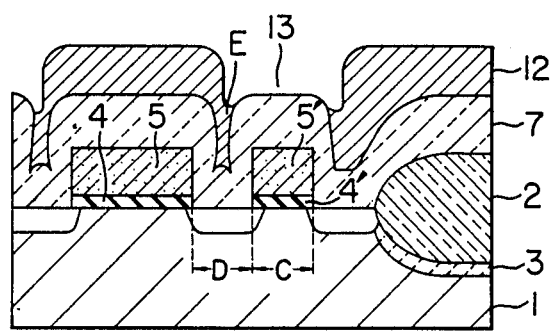
Figure 3G:
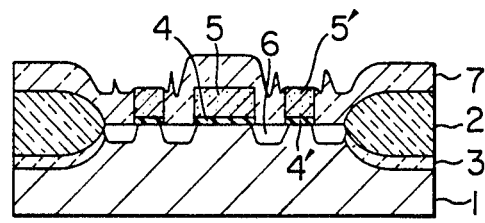
Figure 3H:
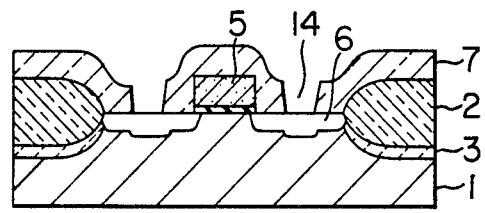
Figure 3I:
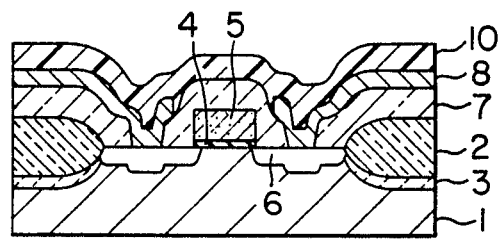

Next, one embodiment of the method of manufacturing a semiconductor device according to this invention will be explained with reference to FIG. 3, which shows cross-sections of the device during sequential steps of the embodiment. In FIG. 3a, 1 denotes a P-type silicon substrate, 2 a silicon dioxide film formed by selective oxidation and 3 a channel stopper formed by a boron diffusion layer. A gate oxidation film 4 of 40 nm and a polycrystalline silicon film 5 of 400 nm are deposited and then doped with phosphorus, as shown in FIG. 3b. Patterns are formed by using photolithography on a gate electrode region 11a, a wiring part (not shown) and a part 11b for leading out an electrode from the diffusion layer, leaving the polycrystalline silicon layer 5, as shown in FIG. 3c. In this step, if we apply reduction projection, the line width C and the gap D can each be made as small as 1 micron. The polycrystalline silicon layer 5 and gate oxidation film 4 are etched to provide the configuration shown in FIG. 3d. Next, an impurity diffusion region 6 having an electrical conductivity type opposite to that of the substrate is formed and a phosphosilicate glass layer 7 deposited thereon, as shown in FIG. 3d. Windows 13 for leading out electrodes are formed by the photolithographic method. Photoresist 12 is applied so as to overlap the resist pattern window on the polycrystalline silicon layer 5'. FIG. 3f shows an enlarged view of the structure where the width C of the polycrystalline silicon layer 5' is 1.2 microns and the gap D is 1.2 microns. Since the window width of the resist 12 is 2 microns, the margin of super-position on the polycrystalline silicon layer 5' is about 0.5 micron on both left the and right sides. The resist remains in a deep groove E in the polycrystalline silicon layer and buries it. Under this condition, the phosphosilicate glass layer 7 on the polycrystalline silicon layer 5' is etched, and phosphosilicate glass on the side of the polycrystalline silicon layer 5 remains, as shown in FIG. 3g. As seen in FIG. 3h, the polycrystalline silicon layer 5' is removed by selective etching with the phosphosilicate glass layer 7 as a mask. Then, the insulation film 4' is etched to form an aperture 14 for electrode connections. In a phosphorus atmosphere, an impurity is diffused into the apertures 14 and at the same time the phosphosilicate glass layer 7 is forced to flow thereby making the surrounding part of the aperture smooth. As shown in FIG. 3i, an aluminum wire 8 is formed and a passivation film 10 is deposited.

If the wiring 8 is formed by a second polycrystalline silicon layer having the one electrical conductivity type, the second polycrystalline silicon layer is deposited after the formation of the apertures 14. Then, the layer is doped with phosphorus to make a connection. The distance between the aperture part formed in the impurity diffusion layer on the substrate and the gate electrode is determined by the formation of a pattern for the polycrystalline silicon layer 5. This part is separated by an interlayer insulation film of phosphosilicate glass. In this way, dependence on the accuracy of the mask adjustment in the step of aperture formation becomes small. For example, even if the mask is shifted by about 0.5 micron, no decrease in the interlayer breakdown voltage appears.

As described above, according to this invention, the formation of the aperture on the substrate does not depend on the accuracy of superposition of the mask on the polycrystalline silicon layer. The electrode layer can be formed by self alignment, separated and insulated from the polycrystalline silicon layer. Therefore, the density of integration of the device can be improved.

I claim:

1. A method of manufacturing a field effect transistor of the insulated gate type comprising the steps of
   (a) depositing successively a first insulation film and an electrode forming material layer on a semiconductor substrate, said substrate having a given electrical conductivity type;
   (b) removing at least first and second portions of said electrode forming material layer and said insulation film from said substrate to form therefrom a gate electrode and another element spaced from said gate electrode by a first exposed portion of said substrate, a second exposed portion of said substrate being located adjacent said another element opposite the side thereof facing said gate electrode;
   (c) introducing an impurity into said first and second exposed portions of said substrate thereby forming first and second impurity diffusion regions, said impurity diffusion regions having an electrical conductivity type opposite that of said substrate;
   (d) forming a second insulation film over said electrode forming material and the first and second exposed portions of said substrate;
   (e) removing said second insulation film from said another element;
   (f) removing said another element, including the electrode forming material layer and the first insulation film thereunder forming said another element, to expose a third portion of said substrate; and
   (g) introducing an impurity into said exposed third portion of said substrate to form a third diffusion region having an electrical conductivity type opposite that of said substrate, whereby said first, second and third diffusion regions overlap to form a source or drain region of said field effect transistor.

2. The method of manufacturing a field effect transistor as defined by claim 1 wherein said electrode forming material layer is made from polycrystalline silicon, and which further comprises the step of forming an electrically conductive film in contact with said third diffusion region.

3. The method of manufacturing a field effect transistor as defined by claim 2 wherein the concentration of the impurity of said third diffusion region is higher than that of said first and second diffusion regions.

* * * * *